United States Patent
Boone et al.

(10) Patent No.: US 6,485,999 B1
(45) Date of Patent: Nov. 26, 2002

(54) WIRING ARRANGEMENTS HAVING ELECTRICALLY CONDUCTIVE CROSS CONNECTIONS AND METHOD FOR PRODUCING SAME

(75) Inventors: Luc Boone, Oostkamp; Hubert De Steur, Drongen; Marcel Heermann, Merelbeke; Jozef Van Puymbroeck, Oostkamp, all of (BE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/743,568

(22) PCT Filed: Jul. 1, 1999

(86) PCT No.: PCT/EP99/04565

§ 371 (c)(1),
(2), (4) Date: Jan. 10, 2001

(87) PCT Pub. No.: WO00/03571

PCT Pub. Date: Jan. 20, 2000

(30) Foreign Application Priority Data

Jul. 10, 1998 (DE) .......................................... 198 30 964

(51) Int. Cl.⁷ .............................................. H01L 21/50
(52) U.S. Cl. ...................................... 438/106; 438/384
(58) Field of Search ................................ 438/106, 384; 437/209; 428/326; 156/645, 245; 174/260

(56) References Cited

U.S. PATENT DOCUMENTS

| 4,487,654 A | * | 12/1984 | Coppin ...................... 156/645 |
| 4,645,732 A |   | 2/1987 | Young |
| 4,943,346 A |   | 7/1990 | Mattelin |
| 5,492,586 A | * | 2/1996 | Gorczyca .................... 156/245 |
| 5,527,741 A | * | 6/1996 | Cole et al. .................. 437/209 |
| 5,929,516 A |   | 7/1999 | Heermann et al. |
| 6,165,629 A | * | 12/2000 | Sachdev et al. ............ 428/326 |
| 6,191,367 B1 | * | 2/2001 | Hayashi ...................... 174/260 |
| 6,323,096 B1 | * | 11/2001 | Saia et al. .................. 438/384 |

FOREIGN PATENT DOCUMENTS

| DE | 37 32 249 | 4/1989 |
| EP | 0 361 192 | 4/1990 |
| EP | 0 575 848 | 12/1993 |
| EP | 0 645 953 | 3/1995 |
| EP | 0 711 102 | 5/1996 |
| EP | 0 740 497 | 10/1996 |
| WO | WO 89/00346 | 1/1989 |
| WO | WO 96/09646 | 3/1996 |
| WO | WO 98/27588 | 6/1998 |

OTHER PUBLICATIONS

US Patent Application Publication US 2002/0019076 A1 (Farworth et al) 438/119.*
"BGA–13 die Alternative" *Productronic 5*, 1994, pp. 54–55.
Abstract of Japanese Published Application 63166555 (Sep. 7, 1988), *Patent Abstracts of Japan*, vol. 12, No. 432 (M–763), Nov. 15, 1988.

(List continued on next page.)

*Primary Examiner*—David Nelms
*Assistant Examiner*—Thinh Nguyen
(74) *Attorney, Agent, or Firm*—Harness, DIckey & Pierce, P.L.C.

(57) ABSTRACT

The invention relates to a method for producing interconnections with electrically conductive cross connections between the top and the bottom part of a substrate and interconnections having such cross connections. The substrate (S1) is given a slanted, roof-shaped or convex contour (K1) in the area of at least one front face and/or in the area of at least one inner wall of a recess. After metallizing the substrate (S1), printed-board conductor-shaped cross connections (Q) are produced in the area of the above-mentioned contours (K1) simultaneously with laser structuring of printed board conductors (L) on the top part (0) and the bottom part (U) of the substrate (S1).

13 Claims, 5 Drawing Sheets

OTHER PUBLICATIONS

Abstract of Japanese Published Application 08148803 (Jun. 7, 1996), *Patent Abstracts of Japan,* vol. 96, No. 10, Oct. 31, 1996.

Anderson et al, "Printed Circuit Boards with Multiconductor Through–Holes", *Western Electric Technical Digest,* No. 41, Jan. 1976, pp. 1–2.

* cited by examiner

WIRING ARRANGEMENTS HAVING ELECTRICALLY CONDUCTIVE CROSS CONNECTIONS AND METHOD FOR PRODUCING SAME

BACKGROUND OF THE INVENTION

The number of connections on integrated circuits is becoming ever greater, while said integrated circuits are at the same time becoming miniaturized to an ever greater extent. The difficulties expected in the course of this increase in miniaturization in the application of solder paste and component mounting are intended to be overcome by new housing forms, where emphasis may be given here in particular to single-chip, few-chip or multi-chip modules in the ball grid array package (DE-Z productronic 5, 1994, pages 54, 55). These modules are based on a plated-through substrate, on which contact is made with the chips for example via bonding wires or by means of flip-chip mounting. The ball grid array (BGA) is situated on the underside of the substrate, and is often also referred to as a solder grid array or solder bump array. The ball grid array comprises solder studs arranged over the area on the underside of the substrate, which allow surface mounting on the printed circuit boards or assemblies. The arrangement of the solder studs over an area allows large numbers of connections to be realized, in a coarse grid of 1.27 mm, for example.

In the case of so-called MID technology (MID =Molded Interconnection Devices), injection-molded parts with integrated conductor runs are used instead of conventional printed circuits. High-quality thermoplastics suitable for the injection molding of three-dimensional substrates form the basis of this technology. By comparison with conventional substrate materials for printed circuits, such thermoplastics are distinguished by better mechanical, chemical, electrical and environmental properties. In the case of one specific direction of MID technology, so-called SIL technology wherein SIL stands for the German phrase of Sitzgießteile mit integrierten Leiterzügen which phrase translates to injection-molded parts with integrated conductor runs a metal layer applied to the injection-molded parts is structured without using the mask technique that is otherwise customary, by means of a special laser structuring method. In this case, a plurality of mechanical and electrical functions can be integrated in the three-dimensional injection-molded parts with structured metalization layer. The housing support function is simultaneously taken over by guides and snap-connections while the metalization layer, in addition to the wiring and connection function, also serves as electromagnetic shielding and provides for good heat dissipation. In order to produce electrically conductive. cross connections between two wiring installations on mutually opposite surfaces of the injection-molded parts, corresponding plated-through holes are produced as early as during the injection-molding process. The inner walls of these plated-through holes are then likewise coated with a metal layer during the metalization of the injection-molded parts. Further details relating to the production of three-dimensional injection-molded parts with integrated conductor runs are revealed for example in DE-A-37 32 249 or EP-A-0 361 192.

According to a variant of MID technology which is disclosed in EP-A-0 645 953, a substrate is produced by injection molding and provided with a well and then a first conductor plane, a dielectric layer and a second conductor plane are successively produced, whereupon an electronic component is incorporated in the well, the connections of the component are electrically conductively connected to assigned connection areas on the substrate, preferably by bonding, and then an encapsulation is formed for the component by the well being filled with plastic. A compact, thin structure with a high wiring density is produced. The recessed mounting and encapsulation of components in wells of the injection-molded substrate not only results in a thickness reduction but also attains optimum protection of the component and the connection wiring thereof.

WO-A-96 096 46 has disclosed a so-called polymer stud grid array (PSGA), which combines the advantages of a ball grid array (BGA) with the advantages of MID technology. The new design was called a polymer stud grid array (PSGA) on the basis of the ball grid array (BGA), the term "polymer stud" being intended to refer to polymer studs which are concomitantly formed during the injection molding of the substrate. The new design is suitable for single-chip, few-chip or multi-chip modules and comprises an injection-molded three-dimensional substrate made of an electrically insulating polymer, polymer studs which are arranged over the area on the underside of the substrate and are concomitantly formed during the injection-molding process, external connections which are formed on the polymer studs by a solderable end surface, conductor runs which are formed at least on the underside of the substrate and connect the external connections to internal connections, and at least one chip which is arranged on the substrate and whose connections are electrically conductively connected to the internal connections.

In addition to the simple and cost-effective production of the polymer studs during the injection molding of the substrate, the production of the external connections on the polymer studs can also be carried out with minimal effort together with the production of the conductor runs, which is normal for MID technology and SIL technology. The fine laser structuring which is preferred in SIL technology enables the external connections to be realized on the polymer studs with large numbers of connections in a very fine grid. It should be emphasized, furthermore, that the thermal expansion of the polymer studs corresponds to the thermal expansions of the substrate and to that of the printed circuit board accommodating the module. Should any mechanical stresses occur, then the elastic properties of the polymer studs allow at least partial compensation. The dimensional stability of the external connections formed on the polymer studs also allows the reliability for repair and replacement to be considerably enhanced by comparison with ball grid arrays, whose connections are formed by solder studs. In the case of the polymer stud grid array, the polymer studs and the chip or the chips are usually arranged on the same side of the substrate. In the case of a substrate provided with plated-through holes, the polymer studs and the chip or the chips may perfectly well be arranged on different sides of the substrate as well. Such an arrangement of polymer studs and chips on opposite sides of the substrate is of interest particularly for large chips, which require a multiplicity of assigned external connections.

WO-A-89 00346 discloses single-chip modules which are suitable for surface mounting and are based on an injection-molded three-dimensional substrate with plated-through holes. In addition to these plated-through holes, during the injection-molding process, the substrate acquires a well, arranged centrally on the top side, and a multiplicity of polymer studs arranged in one or else in two peripheral rows on the underside. The chip arranged in the well on the top side is connected to assigned conductor tracks, which lead to the outside in the form of strips, via fine contact-making wires. These conductor tracks are then electrically conductively connected to the assigned, surface-metalized polymer studs over plated-through holes arranged in the outer region. If the edge regions of the substrate are then separated with cutting lines which pass centrally through the plated-through holes, then electrically conductive cross connections with a semicircular cross section are produced, which electrically conductively connect the outer ends of the conductor tracks arranged on the surface of the substrate to the assigned polymer studs arranged on the underside of the substrate.

R. C. ANDERSON et al.: "Printed circuit boards with multi-conductor through-holes", TECHNICCAL DIGEST—WESTERN ELECTRIC, No. 41, January 1976, pages 1–2, discloses substrates with plated-through holes which have a roof-shaped or convex contour. During the photolithographic production of the conductor tracks on the top side and underside of the substrate, optionally a plurality of conductor track-type cross connections are also produced in the same work operation in the region of the plated-through holes, which cross connections connect together mutually assigned conductor tracks on the top side and underside of the substrate.

SUMMARY OF THE INVENTION

The invention of providing a molded substrate with at least one edge with an oblique, roof-shaped or convex contour so that a metallized layer can be partially removed to form a conductive structure extending from one side of the substrate to the other is based on the problem, in the context of MID technology, of simplifying the production of electrically conductive cross connections between conductor structures on the top side and underside of a substrate. In this case, the cross connections are intended to be suitable, in particular, also for the polymer stud grid arrays explained above.

The invention is based on the insight that cross connections can be produced at the same time as the laser structuring of the conductor structures provided that the cross connections are produced, on at least one end of the substrate, at edges with an oblique, roof-shaped or convex contour. The structuring of the cross connections according to the invention can be carried out with minimal outlay since no additional work operation is necessary.

Advantageous refinements of the method according to the invention are molding the substrate by injection molding, compression molding or transfer molding The refinement of the method enables the substrate to be produced simply and in a manner suitable for mass production, in particular, by means of injection molding.

In contrast to a convex contour, the contours of either a roof-shape or oblique facilitate the laser structuring of the cross connections by virtue of their pronounced edges. An accordance with claims 4 and 11, effective laser structuring of the cross connections is ensured in this case. through angles of inclination of at least 110° with respect to the horizontal and/or at least 20° with respect to the vertical.

The refinement of molding studs on the underside of the substrate, which studs are provided with a solderable end surface after the metallization step; enables the cross connections according to the invention to be realized in polymer stud grid arrays.

The development of applying the metallized layer by electroless and electrodeposition of copper; has the advantage that, for the application of the metallization layer, it is possible to resort to technologies which have long proven their worth in the production of printed circuits.

Although the method according to the invention can, in principle, also be carried out using the semiadditive technique, the subtractive technique affords quite a few advantages. In addition to the simple and economical production of the desired conductor patterns, emphasis may be given here in particular to the simple laser structuring of an etching resist. The etching resist can in this case be applied in a particularly simple manner by chemical deposition or electrodeposition of tin or tin-lead.

In accordance with claim 12, the cross connections according to the invention can preferably be used in a polymer stud grid array with a chip arranged on the top side of the substrate. The arrangement of the chip on the top side of the substrate and the arrangement of the polymer studs on the underside of the substrate in this case result in ideal preconditions for realizing so-called chip scale packages, in the case of which the dimensions of the array essentially correspond to the dimensions of the chip.

Exemplary embodiments of the invention are illustrated in the drawing and are described in more detail below.

DESCRIPTION OF THE PREFERRED EMBODIMENTS

Figure 1:
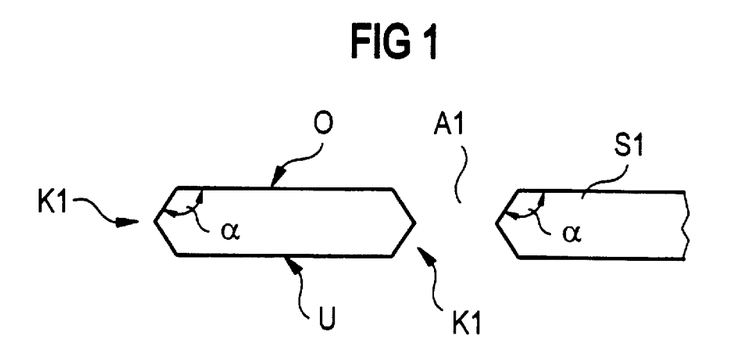
FIG. 1 shows a cross section through a substrate with a roof-shaped contour of the edges relevant to cross connections.

FIG. 1 shows a truncated cross section through a substrate S1, whose discernible end has a roof-shaped contour K1. In the region of a cutout A1 of the substrate S1, which cutout may have a circular, oval, rectangular or square shape, the inner wall likewise has a roof-shaped contour K1. The top side and underside of the substrate S1 are designated by O and U, respectively. The roof-shaped contour K1 illustrated is provided for the production of cross connections that is yet to be explained with reference to FIGS. 4 to 10. The angle of inclination between the roof-shaped contour K1 and the top side O and/or underside U is designated by α, where α is greater than 90° and preferably 110°.

The substrate 1, including the cutout A1 and the roof-shaped contours K1, is produced by injection molding, suitable substrate materials being thermoplastics which are resistant to high temperatures, and include, polyetherimide, polyether sulfone or polyamide.

Figure 2:
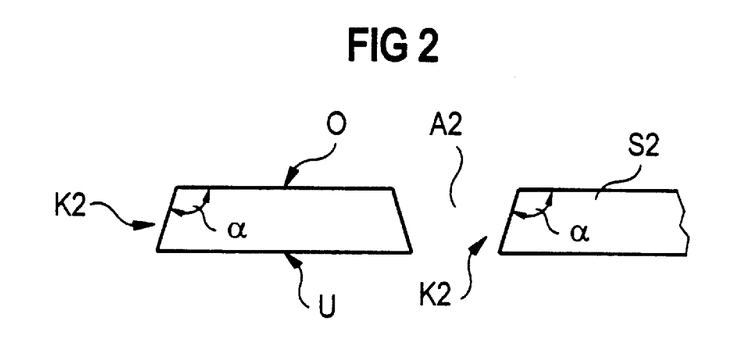
FIG. 2 shows a cross section through a substrate with an oblique contour of the edges relevant to cross connections.

FIG. 2 shows a truncated cross section through a substrate S2, which, in contrast to the substrate illustrated in FIG. 1, has an oblique contour K2 in the region of an end and in the region of a cutout A2. The angle of inclination between the oblique contour K2 and the top side O of the substrate S2 is again designated by α, where α is greater than 90° in this case as well.

Figure 3:
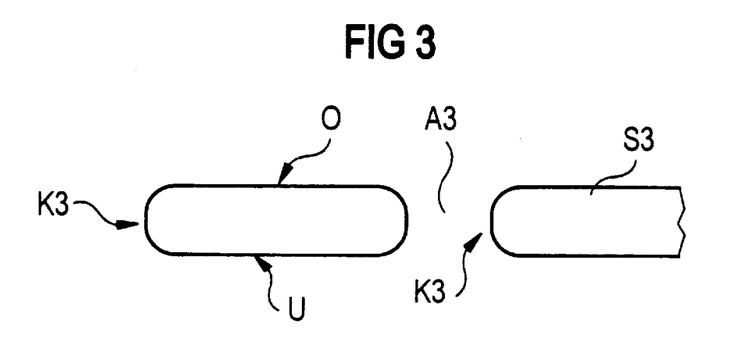
FIG. 3 shows a cross section through a substrate with a convex contour of the edges relevant to cross connections.
Figure 4:
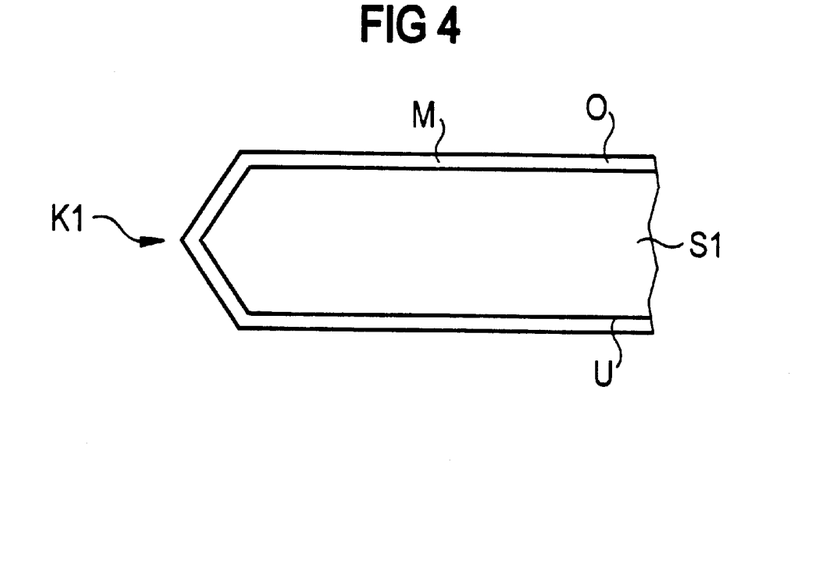
FIG. 4 shows the substrate as shown in FIG. 1 after the application of a metallization layer.

FIG. 3 shows a truncated cross section through a substrate S3, which, in contrast to the substrates illustrated in FIGS. 1 and 2, has a convex contour K3 in the region of an end and in the region of a cutout A3.

By virtue of their special contours K1, K2 and K3, the substrates S1, S2 and S3 illustrated in FIGS. 1 and 3 enable laser structuring of metallization layers applied there. In the case of the contours K1 and K3, this laser structuring is carried out in order to form cross connections from the top side O and from the underside U. In the case of the contour K2, the laser structuring of cross connections is carried out only from the top side O. In a departure from the exemplary embodiment illustrated in FIG. 1, the roof-shaped contour K1 can also have an asymmetrical roof shape.

The substrate S1 illustrated in FIG. 1 is firstly subjected to a series of customary pretreatments, in particular pickling, cleaning, seeding and activation of the seeding. Afterwards, in accordance with FIG. 4, a metallization layer M is applied to the substrate S1 over the whole area by means of the electroless deposition of copper and subsequent electrodeposition of copper.

In accordance with FIG. 5, an etching resist AR is subsequently applied to the metallization layer M by electroless- or by electrodeposition of tin.

Figure 5:
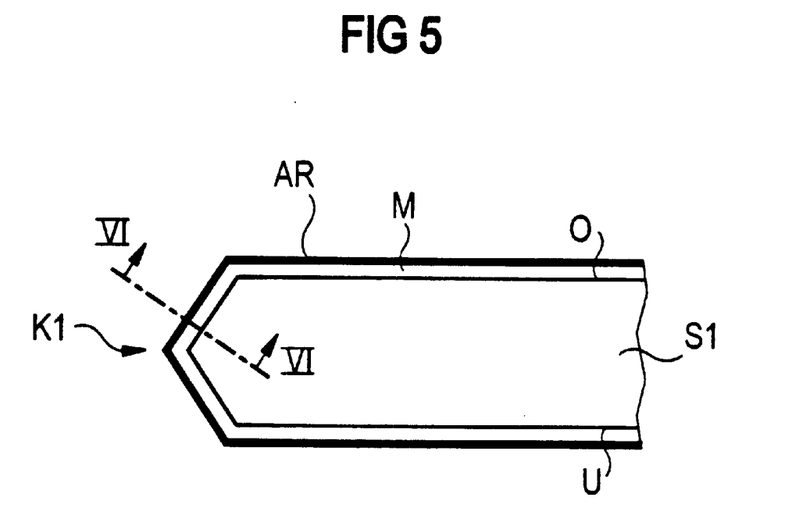
FIG. 5 shows the substrate as shown in FIG. 4 after the application of an etching resist.
Figure 6:
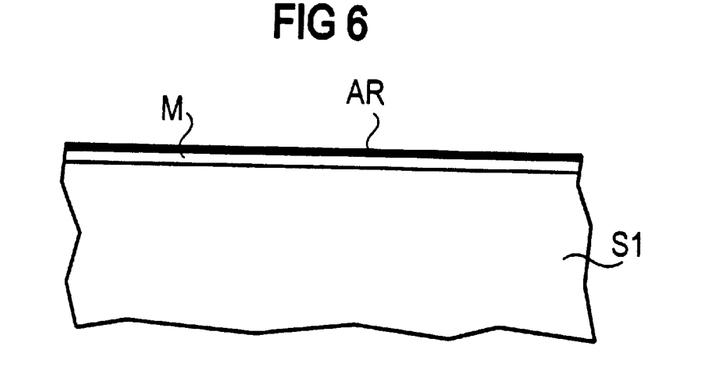
FIG. 6 shows a cross section through a roof-shaped contour of the substrate in accordance with the line VI—VI in FIG. 5.

FIG. 6 shows a truncated cross section through the roof-shaped contour K1 of the substrate Si in accordance with the line VI—VI in FIG. 5.

Figure 7:
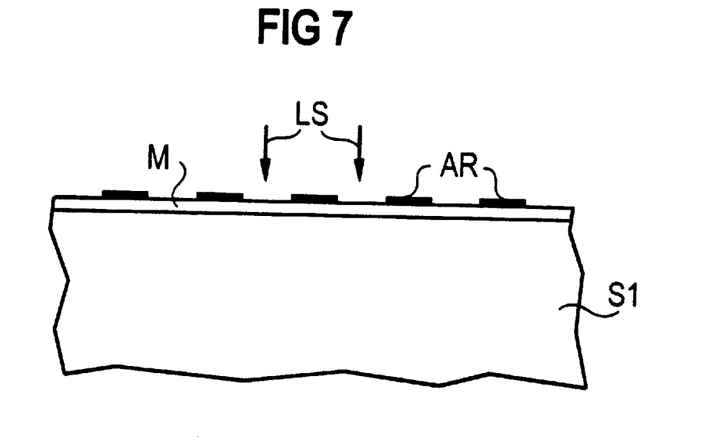
FIG. 7 shows the laser structuring of the etching resist layer in the case of the cross section of the roof-shaped contour as shown in FIG. 6.
Figure 8:
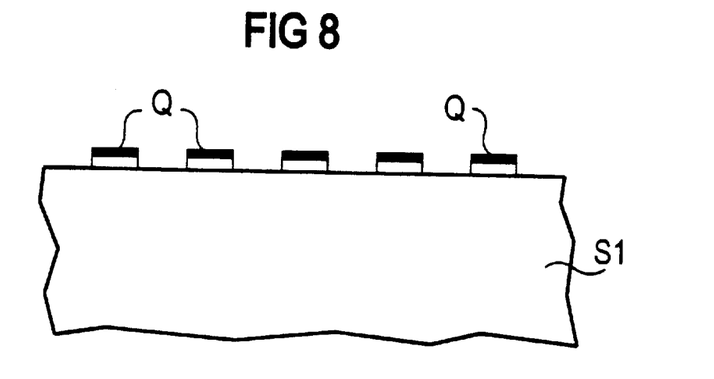
FIG. 8 shows the formation of the cross connections in the case of the cross section of the roof-shaped contour as shown in FIG. 6.

In accordance with FIG. 7, the etching resist AR is removed again by structuring by means of a laser beam LS in those regions of the roof-shaped contour K1 (cf. FIG. 5) which do not correspond to the later cross connections. In this case, the laser beam LS is not oriented perpendicularly to the surface of the roof-shaped contour K1 but perpendicularly to the surface O of the substrate S1 (cf. FIG. 5). Those regions of the metallization layer M which are uncovered by the laser structuring of the etching resist AR are then etched away down to the surface of the substrate S1 as shown in FIG. 8, conductor track-type cross connections Q being produced.

Figure 9:
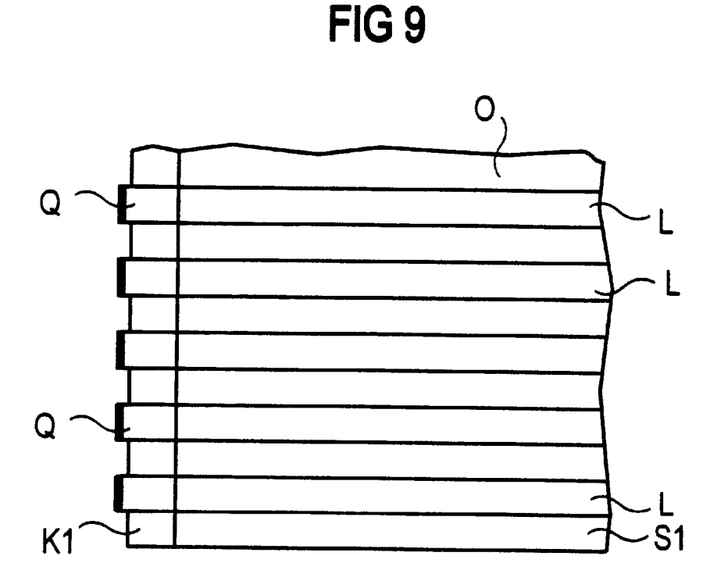
FIG. 9 shows a partial plan view of the top side of the substrate with conductor tracks and cross connections.

FIG. 9 shows a partial plan view of the top side O of the substrate Si and the conductor tracks L formed thereon, which merge in an aligned manner with the assigned cross connections Q in the region of the roof-shaped contour K1. The production of the conductor tracks L on the top side O of the substrate S1 takes place at the same time as the production (which can be seen from FIG. 7) of the adjoining cross connections Q by laser structuring of the etching resist AR and subsequent etching away of the uncovered regions of the metallization layer M.

Figure 10:
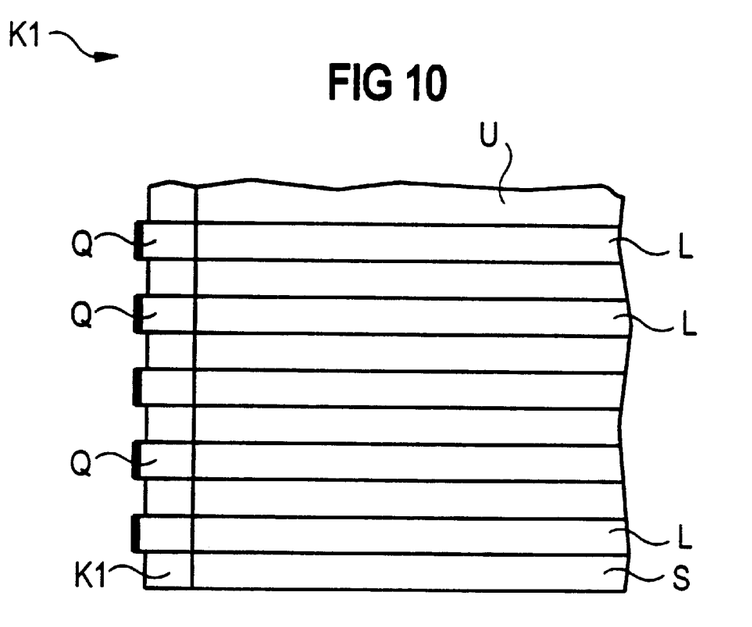
FIG. 10 shows a partial plan view of the underside of the substrate with conductor tracks and cross connections.

In a manner corresponding to FIG. 9, FIG. 10 shows a partial plan view of the underside U of the substrate S1 and the conductor tracks L formed thereon, which merge in an aligned manner with the assigned cross connections Q in the region of the roof-shaped contour K1. The production of the conductor tracks L on the underside U of the substrate S1 takes place at the same time as the production of the adjoining connections Q by laser structuring of the etching resist AR and subsequent etching away of the uncovered regions of the metallization layer M. The laser structuring is thereby performed by a laser beam LS oriented perpendicularly to the underside U of the substrate S1 (cf. FIG. 7).

Figure 11:
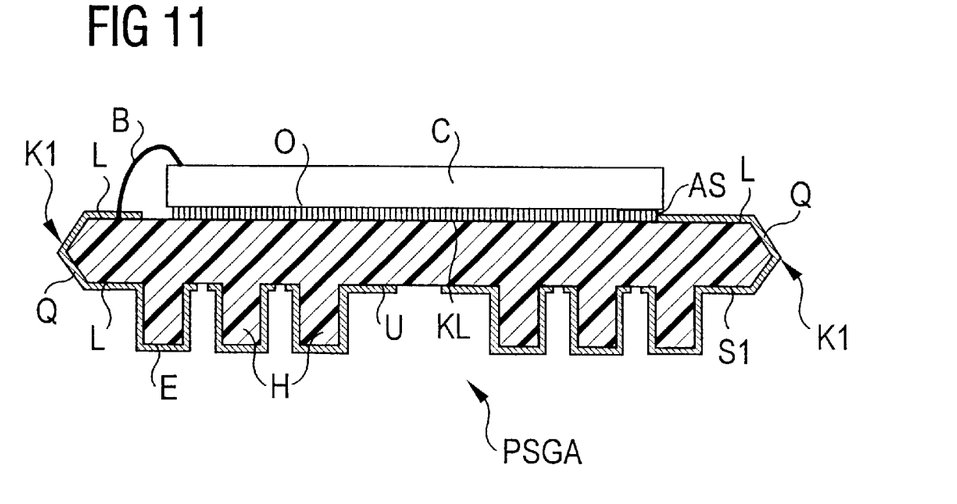
FIG. 11 shows a side view of the substrate formed as a polymer stud grid array.

FIG. 11 shows a side view of the substrate S1 with conductor tracks L, cross connections Q in the region of the roof-shaped contour K1 and with the already mentioned polymer studs H arranged over the area on the underside U. A chip C is applied to the top side O of the substrate S1, contact being made with said chip either using the wire-bonding technology with bonding wires B as illustrated on the left or using the flip-chip technology with connections AS as illustrated on the right.

In-the case of wire-bonding technology, the chip C is joined to the top side O of the substrate S by means of an adhesive layer KL.

FIG. 11 clearly shows that the individual connections of the chip C are electrically conductively connected to assigned polymer studs H via conductor tracks L on the top side O, via cross connections Q at the ends in the region of the roof-shaped contour K1, and via conductor tracks L on the underside U. A solderable end surface E is applied to the underside of the metallized polymer studs H, said end surface E being formed for example by a layer sequence of nickel and gold.

The structure illustrated in FIG. 11 is a polymer stud grid array, which is designated altogether by PSGA. Further details of such polymer stud grid arrays are revealed in WO-A 96 09 646, for example.

In the case of the polymer stud grid array PSGA as shown in FIG. 11, the external dimensions of the chip C and substrate S1 are approximately the same size. Consequently, a form of housing is involved which is usually referred to as a chip scale package. It can also clearly be discerned that the cross connections Q at the ends in the region of the roof-shaped contour K1, being structured extremely finely, enable the entire polymer stud grid array PSGA to be configured extremely compactly, and thus make a crucial contribution to the realization of the chip scale package.

What is claimed is:

1. A method for producing wiring arrangements with electrically conductive cross connections between conductive structures on a top side and on an underside of a substrate, said method comprising the steps of molding a substrate from electrically insulating plastic, said substrate having at least one wall surface being an end wall having a contour selected from an oblique contour, a roof-shaped contour and a convex contour, said molding being selected from injection molding, transfer molding and compression molding; applying a metallized layer to the substrate; partially removing the metalized layer by means of laser beam for the purpose of forming the conductor structure on the top side and on the underside of the substrate and for the purpose of forming conductor track-type cross connections in the region of the at least one wall surface of the substrate.

2. A method according to claim 1, wherein the step of molding is by injection molding.

3. A method according to claim 1, wherein the at least one wall surface acquires a contour selected from oblique contours and roof-shaped contours.

4. A method according to claim 3, wherein the wall surface is inclined at an angle α of at least 110° with one of the top side and underside of the substrate.

5. A method according to claim 1, wherein during the step of molding, polymers studs are formed in the area of the underside of the substrate and after the application of the metallization layer, a solderable end surface is applied to the polymer studs.

6. A method according to claim 1, wherein the step of applying a metallized layer deposits the layer on the substrate by electroless deposition of copper and electrodeposition of copper.

7. A method according to claim 1, which includes, after application of the metallized layer, applying an etch resist to the metallized layer and then removing the etch resist by structuring means with a laser beam in the regions not corresponding to the desired conductor pattern, and then etching uncovered regions of the metallized layer down to the surface of the substrate.

8. A method according to claim 7, wherein the step of applying the etch resist is by electrodepositing of a material selected from tin and tin-lead.

9. A wiring arrangement on a substrate with electrically conductive cross connections between conductor structures on a top side of the substrate and on an underside of the substrate, said substrate having at least one end with a contour selected from an oblique contour, a roof-shaped contour and a convex contour, and the cross connections being in the form of conductor tracks arranged in the region of the above-mentioned contour of at least one end of the substrate.

10. A wiring arrangement according to claim 9, wherein the at least one end has a contour selected from an oblique contour and a roof-shaped contour.

11. A wiring arrangement according to claim 10, wherein the end is inclined at an angle of at least 110° with respect one of the top side and underside of the substrate.

12. A wiring arrangement according to claim 10, which includes polymer studs which are formed integrally and arranged over an area of the underside of the substrate, a chip arranged on the top side of the substrate using a technology selected from wire bonding technology and flip-chip technology, said studs having solderable end surfaces applied thereto, the solderable end surfaces of the polymer studs being electrically connected to an assigned connection of the chip in each case via a conductor track on the underside of the substrate, the cross connect and a conductor track on the top side of the substrate.

13. A wiring arrangement according to claim 9, wherein the substrate has polymer studs integrally arranged over an area of an underside thereof, each of said polymer studs having a solderable end surface applied thereto, a chip arranged on the top side of the substrate and being bonded to a conductor track on the top side of the substrate, so that the solderable end surfaces of the polymer stud are electrically conductively connected to an assigned connection of the chip via a conductor track on the underside of the substrate, a cross connect and the conductor track on the top side of the substrate.

* * * * *